United States Patent
Nakajima et al.

(10) Patent No.: US 9,676,968 B1
(45) Date of Patent: Jun. 13, 2017

(54) HEAT-RESISTANT ADHESIVE SHEET FOR SEMICONDUCTOR INSPECTION AND SEMICONDUCTOR INSPECTION METHOD

(71) Applicant: Denka Company Limited, Tokyo (JP)

(72) Inventors: Gosuke Nakajima, Shibukawa (JP); Masanobu Kutsumi, Shibukawa (JP)

(73) Assignee: DENKA COMPANY LIMITED, Tokyo (JP)

(*) Notice: Subject to any disclaimer, the term of this patent is extended or adjusted under 35 U.S.C. 154(b) by 0 days.

(21) Appl. No.: 15/310,315

(22) PCT Filed: May 11, 2015

(86) PCT No.: PCT/JP2015/063521
§ 371 (c)(1),
(2) Date: Nov. 10, 2016

(87) PCT Pub. No.: WO2015/174381
PCT Pub. Date: Nov. 19, 2015

(30) Foreign Application Priority Data

May 12, 2014 (JP) ................................ 2014-098944

(51) Int. Cl.
| | | |
|---|---|---|
| *C09J 7/02* | (2006.01) | |
| *C09J 4/06* | (2006.01) | |
| *C09J 11/08* | (2006.01) | |
| *H01L 21/66* | (2006.01) | |
| *H01L 21/78* | (2006.01) | |
| *H01L 23/00* | (2006.01) | |

(52) U.S. Cl.
CPC ............... *C09J 7/0275* (2013.01); *C09J 4/06* (2013.01); *C09J 11/08* (2013.01); *H01L 21/78* (2013.01); *H01L 22/12* (2013.01); *H01L 22/32* (2013.01); *H01L 24/32* (2013.01); *H01L 24/83* (2013.01); *C09J 2203/326* (2013.01); *C09J 2423/006* (2013.01); *C09J 2451/00* (2013.01); *C09J 2483/00* (2013.01); *H01L 2224/8322* (2013.01)

(58) Field of Classification Search
CPC ............ C09J 7/0275; C09J 4/06; C09J 11/08
See application file for complete search history.

(56) References Cited

U.S. PATENT DOCUMENTS

| | | | | |
|---|---|---|---|---|
| 5,637,395 A | * | 6/1997 | Uemura ............... | C08G 18/625 257/E21.505 |
| 6,455,335 B1 | | 9/2002 | Kohno et al. ............ | 438/14 |
| 2002/0140063 A1 | * | 10/2002 | Yamazaki ................ | C09J 7/02 257/668 |
| 2002/0182796 A1 | | 12/2002 | Kohno et al. ............ | 438/200 |
| 2003/0203521 A1 | | 10/2003 | Kohno et al. ............ | 438/15 |
| 2006/0246279 A1 | * | 11/2006 | Urairi ...................... | B23K 26/18 428/345 |
| 2011/0189835 A1 | * | 8/2011 | Sugo ........................ | B32B 7/12 438/464 |
| 2011/0237050 A1 | * | 9/2011 | Sugimura ........... | H01L 21/6836 438/465 |
| 2013/0330910 A1 | * | 12/2013 | Tanaka ................ | H01L 21/6836 438/462 |
| 2016/0130481 A1 | | 5/2016 | Nakajima et al. ........ | 133/8 |

FOREIGN PATENT DOCUMENTS

| | | |
|---|---|---|
| JP | H 11-97494 A | 4/1999 |
| JP | 2004-31463 A | 1/2004 |
| JP | 2006-188607 A | 7/2006 |
| JP | 2007-246860 A | 9/2007 |
| JP | 2008-69185 A | 3/2008 |
| JP | 2009-245989 A | 10/2009 |
| JP | 2012-209384 A | 10/2012 |
| JP | 2012-248640 A | 12/2012 |
| WO | WO 2014/199993 A1 | 12/2014 |

OTHER PUBLICATIONS

International Search Report dated Jul. 28, 2015, issued to International Application No. PCT/JP2015/063521.

* cited by examiner

*Primary Examiner* — Errol Fernandes
(74) *Attorney, Agent, or Firm* — Stein IP, LLC

(57) ABSTRACT

A heat resistant adhesive sheet is provided that does not easily develop deformation of an adhesive sheet due to heating. Such an adhesive sheet made by laminating an adhesive layer to a substrate is provided, characterized in that the substrate is heat shrinkable and the adhesive layer contains a (meth)acrylate copolymer, a photopolymerizable compound, a polyfunctional isocyanate curing agent, and a photopolymerization initiator and does not substantially contain a tackifying resin. This adhesive sheet is not deformed even when heated. Since the adhesive does not substantially contain a tackifying resin, softening of the adhesive layer does not occur even when the sheet is heated.

9 Claims, No Drawings

HEAT-RESISTANT ADHESIVE SHEET FOR SEMICONDUCTOR INSPECTION AND SEMICONDUCTOR INSPECTION METHOD

CROSS-REFERENCE TO RELATED APPLICATIONS

This application is a national stage of International Application No. PCT/JP2015/063521, filed May 11, 2015, which claims the benefit of priority to Japanese Application No. 2014-098944, filed May 12, 2014, in the Japanese Patent Office, the disclosures of which are incorporated herein in their entireties by reference.

TECHNICAL FIELD

The present invention relates to a heat resistant adhesive sheet for semiconductor inspection and a semiconductor inspection method using the adhesive sheet.

BACKGROUND ART

A semiconductor wafer is formed with a circuit and then bonded to an adhesive sheet, followed by being arranged to each step of cutting (dicing) into small element pieces, washing, drying, drawing (expanding) of the adhesive sheet, peeling (picking up) the small element pieces from the adhesive sheet, mounting, and the like. The adhesive sheet (dicing tape) used in these steps is desired to have sufficient tack strength for the cut small element pieces (chips) from the dicing step to the drying step while having reduced tack strength to cause no adhesive transfer in the picking up step.

Such an adhesive sheet includes a sheet made by applying an adhesive layer that develops polymerization curing reaction by ultraviolet rays and the like on a substrate transmissive to activating rays, such as ultraviolet rays and/or electron beams. Using such an adhesive sheet, a method of irradiating the adhesive layer with ultraviolet rays and the like after the dicing step for polymerization curing of the adhesive layer to reduce the tack strength, followed by picking up the cut chip is employed.

As examples of such an adhesive sheet, PTLs 1 and 2 disclose adhesive sheets with a substrate surface on which an adhesive is applied containing a compound (polyfunctional oligomer), for example, capable of being three dimensionally networked by activating rays and having a photopolymerizable unsaturated double bond in a molecule.

CITATION LIST

Patent Literature

PTL 1: JP 2009-245989A
PTL 2: JP 2012-248640A

SUMMARY OF INVENTION

Technical Problem

In the semiconductor equipment manufacturing procedure, processing and performance inspection are carried out in the following order:
dicing of a semiconductor wafer;
performance inspection (normal temperature);
packaging; and
performance inspection (high temperature and normal temperature).

In the above procedure, a chip malfunctioning at high temperatures is not distinguished until the performance inspection after the packaging. All the chips including chips malfunctioning at high temperatures thus have to be packaged, leading to an increase in packaging costs.

The case of carrying out the performance inspection after the dicing at high temperatures leads to reduction in the packaging costs. However, the performance inspection in this case is carried out in a state where semiconductor chips are bonded to an adhesive sheet, such as a dicing tape, and heating of the semiconductor chips sometimes causes deformation of the adhesive sheet due to deflection or excessively close adhesion.

Deformation of an adhesive sheet causes a shift in the position of the semiconductor chip and does not allow automatic alignment of an electrode pad formed on the chip and an inspection probe, resulting in taking a longer period for inspection. Further, greater deformation may cause the chip to make contact with the inspection probe, thereby not allowing inspection. In addition, a narrow gap between such semiconductor chips may cause contact of the chips, leading to break or reduce the strength of the chips.

Moreover, excessively close adhesion of the adhesive sheet to the semiconductor chips causes the tack strength of the adhesive layer not to be sufficiently reduced even when the adhesive layer is cured by irradiation with ultraviolet rays and the like, resulting in difficulty in picking up and failures, such as an adhesive transfer.

The present invention has been made in view of such circumstances and is to provide an adhesive sheet enabling inspection of a semiconductor wafer under heating.

Solution to Problem

According to the present invention, a heat resistant adhesive sheet for semiconductor inspection is provided, the adhesive sheet used in a step of performance inspection of a semiconductor chip under heating, the adhesive sheet including an adhesive layer on a substrate, wherein the substrate has a thermal shrinkage when heated at 120° C. for 15 minutes from 1.0% to 5.0%, and the adhesive layer includes: 100 parts by mass of a (meth)acrylate copolymer; from 5 to 200 parts by mass of a photopolymerizable compound; from 0.5 to 20 parts by mass of a polyfunctional isocyanate curing agent; from 0.1 to 20 parts by mass of a photopolymerization initiator; and from 0 to 2 parts by mass of a tackifying resin.

The present inventors have found that use of the heat shrinkable film as a substrate for an adhesive sheet enables deformation restriction by giving tension to the adhesive sheet after heating and softening of the adhesive layer due to heating is caused by softening of the tackifying resin contained in the adhesive.

Based on the findings, they have found that use of the adhesive sheet provided with an adhesive layer of the above composition on a substrate having a thermal shrinkage in the above range enables inspection of a semiconductor wafer in a heated condition, thereby completing the present invention.

Various embodiments of the present invention are disclosed below as examples. The following embodiments may be combined with each other.

Preferably, the substrate is a biaxially oriented film.
Preferably, the adhesive layer of the adhesive sheet includes a peelability imparting agent.
Preferably, the peelability imparting agent is made from a silicone-based graft copolymer.

Preferably, the peelability imparting agent is added in an amount from 0.1 to 20 parts by mass based on 100 parts by mass of the (meth)acrylate copolymer.

Preferably, the polyfunctional isocyanate curing agent has three or more isocyanate groups.

Preferably, the photopolymerization initiator has a mass reduction rate, when heated from 23° C. at a rate of temperature rise of 10° C./min., of 10% at a temperature of 250° C. or more.

According to another aspect of the present invention, a semiconductor inspection method is provided that includes: adsorbing a semiconductor chip by placing the semiconductor chip in a state of being bonded to an adhesive sheet on a stage from 100 to 150° C. to contact the adhesive sheet with the stage for adsorption fixation; inspecting performance of the semiconductor chip while heating the stage from 100 to 150° C.; irradiating the adhesive sheet with an activating ray; and picking up the semiconductor chip from the adhesive sheet, wherein the adhesive sheet is the above adhesive sheet.

Preferably, the method further includes, before the adsorbing: bonding the adhesive sheet to a semiconductor wafer; and dicing the semiconductor wafer into the semiconductor chip.

Advantageous Effects of Invention

The present invention provides an adhesive sheet that does not easily develop deformation of an adhesive sheet and softening of an adhesive layer due to heating and enables inspection of a semiconductor wafer in a heated condition. Conventional wafer inspection under heating used to be carried out after the semiconductor packaging step, whereas the present invention enables wafer inspection under heating before the packaging step. That is, the present invention enables distinguishment of a faulty chip under heating before the packaging step, so that the faulty chip does not have to be packaged, leading to reduction in packaging costs.

DESCRIPTION OF EMBODIMENTS

Preferred embodiments to carry out the present invention are described below. The embodiments described below are merely examples of representative embodiments of the present invention and do not cause the scope of the present invention to be narrowly understood.
1. Adhesive Sheet
(1) Substrate
(2) Photocurable Adhesive
  (2-1) Substantially Not Containing Tackifying Resin
  (2-2) (Meth)Acrylate Copolymer
  (2-3) Photopolymerizable Compound
  (2-4) Polyfunctional Isocyanate Curing Agent
  (2-5) Photopolymerization Initiator
2. Semiconductor Inspection Method
(1) Bonding Step
(2) Dicing Step
(3) Adsorbing Step
(4) Inspecting Step
(5) Activating Ray Irradiating Step
(6) Picking up Step
1. Adhesive Sheet An adhesive sheet according to the present invention is made by laminating a photocurable adhesive layer (hereinafter, may be simply referred to as "an adhesive layer") to a heat shrinkable substrate and is characterized by substantially not containing a tackifying resin in the adhesive layer. The adhesive sheet according to the present invention is not deformed even when it is heated. The adhesive sheet according to the present invention produces little or no softening of the adhesive layer caused by softening of a tackifying resin and thus does not excessively closely adhere to the semiconductor wafer. Accordingly, the adhesive sheet according to the present invention is capable of preventing an increase in the inspection time, breakage of the semiconductor chip, and the like due to deformation of the adhesive sheet. Further, irradiation with ultraviolet rays and the like sufficiently reduces the adhesion strength of the adhesive layer, thereby preventing pickup failures and adhesive transfers.
(1) Substrate A material for the substrate has a thermal shrinkage, when heated at 120° C. for 15 minutes, from 1.0% to 5.0% and preferably from 1.5% to 4.0%. A thermal shrinkage of less than 1.0% causes less shrinkage of the substrate under heating and may cause deformation of the adhesive sheet due to thermal expansion and the like of the substrate. A thermal shrinkage of more than 5.0% causes too much shrinkage of the substrate under heating and may cause peeling of the adhesive sheet from a ring frame or breakage of the substrate. Here, the thermal shrinkage is a value obtained from the following formula.

$$(L_0-L_1)/L_0 \times 100 (\%)$$

$L_0$: length of the substrate before heating (10 cm)
$L_1$: length of the substrate after heating at 120° C. for 15 minutes and cooling to room temperature The substrate is preferably biaxially oriented. The biaxial orientation facilitates shrinkage of the substrate under heating. Examples of such substrate include polyolefin, such as polyethylene and polypropylene, polystyrene, polyvinyl chloride, and the like. A method of forming the substrate is not particularly limited and examples of the method include a method in which a resin extruded from a T die is drawn to be formed into a sheet. In addition, without impairing the performance, such substrate may contain additives, such as an antioxidant, an antistatic agent, a lubricant, an antiblocking agent, and a filler.

The substrate may be a single layer or multilayer film or sheet of the above material or may be a lamination of films and the like of different materials. The substrate has a thickness from 10 to 100 μm and preferably from 20 to 80 μm.

The substrate is preferably subjected to antistatic treatment. Such antistatic treatment includes treatment to blend an antistatic agent in the substrate, treatment to apply an antistatic agent on a substrate surface, and treatment by corona discharge.

As such an antistatic agent, for example, a quaternary amine salt monomer and the like may be used. Examples of the quaternary amine salt monomer include dimethylaminoethyl(meth)acrylate quaternary chloride, diethylaminoethyl (meth)acrylate quaternary chloride, methylethylaminoethyl (meth)acrylate quaternary chloride, p-dimethylaminostyrene quaternary chloride, and p-diethylaminostyrene quaternary chloride. Among them, dimethylaminoethyl methacrylate quaternary chloride is preferred.
(2) Photocurable Adhesive A photocurable adhesive that forms an adhesive layer of the adhesive sheet according to the present invention contains a (meth)acrylate copolymer, a photopolymerizable compound, a polyfunctional isocyanate curing agent, and a photopolymerization initiator and does not substantially contain a tackifying resin.

(2-1) Substantially Not Containing Tackifying Resin

The tackifying resin, which causes softening of the adhesive layer due to heating is a resin conventionally blended to increase tack of acrylic bonding agents. Examples of such resin include, but not particularly limited to, rosin-based resins, terpene-base resins, aliphatic petroleum resins, aromatic petroleum resins, hydrogenated petroleum resins, chroman-indene resins, styrene-based resins, xylene resins, and mixtures of these resins.

Although the adhesive preferably does not contain a tackifying resin at all, the adhesive may contain a tackifying resin to the extent of almost not causing softening of the adhesive layer under heating. Specifically, 2 parts by mass or less (preferably, 0.5 parts by mass or less) of a tackifying resin may be contained based on 100 parts by mass of the (meth)acrylate copolymer. That is, "substantially not containing a tackifying resin" means that a tackifying resin is blended in an amount from 0 to 2 parts by mass (preferably, from 0 to 0.5 parts by mass) based on 100 parts by mass of the (meth)acrylate copolymer.

As long as a tackifying resin is substantially not contained, various additives, such as a peelability imparting agent, an antioxidant, a filler, a ultraviolet absorber, and a light stabilizer, may be added to the adhesive. Although the peelability imparting agent to be added is not particularly limited in an amount, it is preferably from 0.1 to 20 parts by mass based on 100 parts by mass of the (meth)acrylate copolymer and more preferably from 0.2 to 10 parts by mass and even more preferably from 0.5 to 5 parts by mass. As the peelability imparting agent, for example, a silicone-based graft polymer (or copolymer) may be used.

(2-2) (Meth)Acrylate Copolymer

The (meth)acrylate copolymer is a polymer only of a (meth)acrylate monomer or a copolymer of a (meth)acrylate monomer and a vinyl compound monomer. The term (meth) acrylate is the generic name for acrylate and methacrylate. The terms of compounds including (meth), such as (meth) acrylic acid, are also the generic names for compounds having and not having "meth" in their designations.

Examples of the (meth)acrylate monomer include butyl (meth)acrylate, 2-butyl (meth)acrylate, t-butyl (meth)acrylate, pentyl (meth)acrylate, octyl (meth)acrylate, 2-ethylhexyl (meth)acrylate, nonyl (meth)acrylate, decyl (meth) acrylate, lauryl (meth)acrylate, methyl (meth)acrylate, ethyl (meth)acrylate, isopropyl (meth)acrylate, tridecyl (meth) acrylate, myristyl (meth)acrylate, cetyl (meth)acrylate, stearyl (meth)acrylate, cyclohexyl (meth)acrylate, isobornyl (meth)acrylate, dicyclopentanyl (meth)acrylate, benzyl (meth)acrylate, methoxyethyl (meth)acrylate, ethoxyethyl (meth)acrylate, butoxymethyl (meth)acrylate, ethoxy-n-propyl (meth)acrylate, 2-hydroxyethyl (meth)acrylate, 2-hydroxypropyl (meth)acrylate, 4-hydroxybutyl (meth)acrylate, and the like.

Examples of the vinyl compound monomer copolymerizable with the (meth)acrylate monomer include functional group containing monomers having one or more of functional groups, such as a carboxyl group, an epoxy group, an amide group, an amino group, a methylol group, a sulfonic acid group, a sulfamic acid group, and a phosphoric (phosphorous) ester group.

The monomer having a carboxyl group includes, for example, (meth)acrylic acid, crotonic acid, maleic acid, itaconic acid, fumaric acid, acrylamide N-glycolic acid, and cinnamic acid.

The monomer having an epoxy group includes, for example, allyl glycidyl ether and glycidyl ether (meth) acrylate.

The monomer having an amide group includes, for example, (meth)acrylamide.

The monomer having an amino group includes, for example, N,N-dimethylaminoethyl (meth)acrylate.

The monomer having a methylol group includes, for example, N-methylolacrylamide.

(2-3) Photopolymerizable Compound

Examples of the photopolymerizable compound include trimethylolpropane triacrylate, tetramethylolmethane tetraacrylate, pentaerythritol triacrylate, pentaerythritol tetraacrylate, dipentaerythritol monohydroxypentaacrylate, dipentaerythritol hexaacrylate, 1,4-butylene glycol diacrylate, 1,6-hexanediol diacrylate, polyethylene glycol diacrylate, cyanuric triethyl acrylate, commercially available oligoester acrylate, and the like.

As the photopolymerizable compound, a urethane acrylate oligomer may be used other than the above acrylate compounds. The urethane acrylate oligomer is produced by reacting (meth)acrylate having a hydroxy group with a terminal isocyanate urethane prepolymer obtained by reacting a polyisocyanate compound with a polyol compound of polyester type, polyether type, or the like.

Examples of such a polyisocyanate compound include 2,4-tolylene diisocyanate, 2,6-tolylene diisocyanate, 1,3-xylene diisocyanate, 1,4-xylene diisocyanate, diphenylmethane 4,4-diisocyanate, trimethylhexamethylene diisocyanate, hexamethylene diisocyanate, isophorone diisocyanate, and the like. Examples of such (meth)acrylate having a hydroxy group include 2-hydroxyethyl (meth) acrylate, 2-hydroxypropyl (meth)acrylate, polyethylene glycol (meth)acrylate, pentaerythritol triacrylate, glycidol di(meth)acrylate, dipentaerythritol monohydroxypentaacrylate, and the like.

A preferred photopolymerizable compound is a urethane acrylate oligomer having four or more vinyl groups because of good curing of the adhesive after irradiation with ultraviolet rays and the like.

The photopolymerizable compound is blended in an amount from 5 to 200 parts by mass based on 100 parts by mass of the (meth)acrylate copolymer, more preferably from 20 to 180 parts by mass, and even more preferably from 50 to 150 parts by mass. A smaller amount of the photopolymerizable compound causes reduction of peelability of the adhesive sheet after irradiation with ultraviolet rays and the like and tends to cause semiconductor chip pickup failures. In contrast, a greater amount of the photopolymerizable compound tends to cause pickup failures due to scraping up of the adhesive during dicing and, due to the reaction residue, develops a small adhesive transfer that causes contamination.

(2-4) Polyfunctional Isocyanate Curing Agent

The polyfunctional isocyanate curing agent has two or more isocyanate groups and examples thereof include aromatic polyisocyanate, aliphatic polyisocyanate, alicyclic polyisocyanate, and a dimer, a trimer, an adduct, and the like thereof.

Examples of the aromatic polyisocyanate include 1,3-phenylene diisocyanate, 4,4'-diphenyl diisocyanate, 1,4-phenylene diisocyanate, 4,4'-diphenylmethane diisocyanate, 2,4-tolylene diisocyanate, 2,6-tolylene diisocyanate, 4,4'-toluidine diisocyanate, 2,4,6-triisocyanate toluene, 1,3,5-triisocyanate benzene, dianisidine diisocyanate, 4,4'-diphenyl ether diisocyanate, 4,4',4"-triphenylmethane triisocyanate, ω,ω'-diisocyanate-1,3-dimethylbenzene, ω,ω'-diisocyanate-1,4-dimethylbenzene, ω,ω'-diisocyanate-1,4-diethylbenzene, 1,4-tetramethylxylylene diisocyanate, and 1,3-tetramethylxylylene diisocyanate.

Examples of the aliphatic polyisocyanate include trimethylene diisocyanate, tetramethylene diisocyanate, hexamethylene diisocyanate, pentamethylene diisocyanate, 1,2-propylene diisocyanate, 2,3-butylene diisocyanate, 1,3-butylene diisocyanate, dodecamethylene diisocyanate, and 2,4,4-trimethylhexamethylene diisocyanate.

Examples of the alicyclic polyisocyanate include 3-isocyanate methyl-3,5,5-trimethylcyclohexyl isocyanate, 1,3-cyclopentane diisocyanate, 1,3-cyclohexane diisocyanate, 1,4-cyclohexane diisocyanate, methyl-2,4-cyclohexane diisocyanate, methyl-2,6-cyclohexane diisocyanate, 4,4'-methylenebis(cyclohexyl isocyanate), 1,4-bis(isocyanate methyl) cyclohexane, and 1,4-bis(isocyanate methyl)cyclohexane.

Examples of the dimer, the trimer, and the adduct include dimers of diphenylmethane diisocyanate, trimers of hexamethylene diisocyanate, adducts of trinnethylolpropane and tolylene diisocyanate, and adducts of trimethylolpropane and hexamethylene diisocyanate.

Among the polyisocyanates described above, those having three or more isocyanate groups are preferred. In particular, timers of hexamethylene diisocyanate, adducts of trimethylolpropane and tolylene diisocyanate, and adducts of trimethylolpropane and hexamethylene diisocyanate are preferred.

The polyfunctional isocyanate curing agent is blended at a ratio from 0.5 to 20 parts by mass based on 100 parts by mass of the (meth)acrylate copolymer and preferably from 1 to 10 parts by mass. In the case of 0.5 parts by mass or more of the polyfunctional isocyanate curing agent, the tack strength is not too strong and pickup failures are thus inhibited. In the case of 20 parts by mass or less of the polyfunctional isocyanate curing agent, the tack strength is not reduced and the semiconductor chip retentivity is maintained during dicing.

(2-5) Photopolymerization Initiator

Examples of the photopolymerization initiator include benzoin, benzoin alkyl ethers, acetophenones, anthraquinones, thioxanthones, ketals, benzophenones, xanthones, and the like.

Examples of such benzoin include benzoin, benzoin methyl ether, benzoin ethyl ether, benzoin propyl ether, and the like.

Examples of such acetophenones include benzoin alkyl ethers, acetophenone, 2,2-dimethoxy-2-acetophenone, 2,2-diethoxy-2-acetophenone, 1,1-dichloroacetophenone, and the like.

Examples of such anthraquinones include 2-methylanthraquinone, 2-ethylanthraquinone, 2-tertiary butyl anthraquinone, 1-chloroanthraquinone, and the like.

Examples of such thioxanthones include 2,4-dimethylthioxanthone, 2,4-diisopropylthioxanthone, 2-chlorothioxanthone, 2,4-diisopropylthioxanthone, and the like.

Examples of such ketals include acetophenone dimethyl ketal, benzyl dimethyl ketal, benzyl diphenyl sulfide, tetramethylthiuram monosulfide, azobisisobutyronitrile, dibenzyl, diacetyl, β-chloranthraquinone, and the like.

The photopolymerization initiator preferably has a mass reduction rate, when heated from a temperature of 23° C. at a rate of temperature rise of 10° C./min. to 500° C., of 10% at a temperature of 250° C. or more. While an adhesive sheet bonded to a wafer or the like is heated from 100 to 150° C. in a heating step described later, volatilization or degradation of the photopolymerization initiator causes insufficient curing of the adhesive layer in a later step of light irradiation step and fails to sufficiently reduce the adhesion strength, causing pickup failures in the following picking up step. The photopolymerization initiator having the above properties and not easily developing volatilization and degradation due to heating is thus preferably used.

Examples of the photopolymerization initiator with the above temperature of 250° C. or more include ethanone, 1-[9-ethyl-6-(2-methylbenzoyl)-9H-carbazole-3-yl]-, 1-(O-acetyloxime) (trade name IRGACURE OXE02 produced by BASF Japan Ltd.), 2,4,6-trimethylbenzoyl-diphenyl-phosphine oxide (trade name LUCIRIN TPO produced by BASF Japan Ltd.),
2-hydroxy-1-{4-[4-(2-hydroxy-2-methyl-propionyl)-benzyl]-phenyl}-2-methyl-propane-1-one (trade name IRGACURE 127 produced by BASF Japan Ltd.),
2-benzyl-2-dinnethylamino-1-(4-morpholinophenyl)-butanone-1 (trade name IRGACURE 369 produced by BASF Japan Ltd.),
2-dimethylamino-2-(4-methyl-benzyl)-1-(4-morpholine-4-yl-phenyl)-butane-1-one (trade name IRGACURE 379 produced by BASF Japan Ltd.),
bis(2,4,6-trimethylbenzoyl)-phenylphosphine oxide (trade name IRGACURE 819 produced by BASF Japan Ltd.), and the like.

Among them, particularly preferred ones, with the above temperature of 270° C. or more, are ethanone, 1-[9-ethyl-6-(2-methylbenzoyl)-9H-carbazole-3-yl]-, 1-(O-acetyloxime) (trade name IRGACURE OXE02 produced by BASF Japan Ltd.),
2,4,6-trimethylbenzoyl-diphenyl-phosphine oxide (trade name LUCIRIN TPO produced by BASF Japan Ltd.), and 2-hydroxy-1-{4-[4-(2-hydroxy-2-methyl-propionyl)-benzyl]-phenyl}-2-methyl-propane-1-one (trade name IRGACURE 127 produced by BASF Japan Ltd.).

The photopolymerization initiator is blended in an amount from 0.1 to 20 parts by mass based on 100 parts by mass of the (meth)acrylate polymer, preferably from 0.2 to 10 parts by mass, and more preferably from 0.5 to 5 parts by mass. A too small amount causes reduction in peelability of the adhesive sheet after radiation exposure and tends to cause semiconductor chip pickup failures. In contrast, a too large amount causes the photopolymerization initiator to bleed out to an adhesive surface, resulting in contamination.

The photopolymerization initiator may be combined with one or more conventionally known photopolymerization accelerators as needed. As such photopolymerization accelerators, benzoic acids, tertiary amine, and the like may be used. Examples of the tertiary amine include triethylamine, tetraethylpentaamine, dimethylamino ether, and the like.

The adhesive layer preferably has a thickness of 3 μm or more and 100 μm or less and particularly preferably 5 μm or more and 20 μm or less. A too thick adhesive layer causes too much tack strength and the pickup performance is reduced. A too thin adhesive layer causes too little tack strength and the chip retentivity during dicing is reduced and peeling between the ring frame and the sheet may occur.

2. Semiconductor Inspection Method

Specific steps of a semiconductor inspection method according to the present invention are described below in order. The following semiconductor inspection method is part of a semiconductor equipment manufacturing procedure.

(1) Bonding Step

First, in a bonding step, an adhesive sheet is bonded to a semiconductor wafer and a ring frame. The semiconductor wafer may be a conventional general purpose wafer, such as a silicon wafer, a gallium nitride wafer, a silicon carbide wafer, and a sapphire wafer. "A semiconductor wafer"

herein includes semiconductor substrates, such as a plastic seal package substrate, an LED substrate, and a glass substrate.

(2) Dicing Step

In a dicing step, the semiconductor wafer is diced into semiconductor chips. "Semiconductor chips" herein includes semiconductor components, such as micro electro mechanical systems (MEMS), transistors, diodes, and LEDs.

(3) Adsorbing Step

In an adsorbing step, the semiconductor chips in a state of being bonded to the adhesive sheet are placed on a stage from 100 to 150° C. to contact the adhesive sheet with the stage for adsorption fixation. The adsorbing step may be carried out by making the adhesive sheet used in the dicing step directly adsorbed to the stage without removing the semiconductor chips obtained in the dicing step from the adhesive sheet or may be carried out by removing the semiconductor chips obtained in the dicing step from the adhesive sheet, followed by bonding the semiconductor chips to another adhesive sheet for adsorption of this adhesive sheet to the stage.

(4) Inspecting Step

In an inspecting step, to test a circuit formed on the semiconductor chip, performance of the semiconductor chip is inspected after the adsorbing step while the stage is heated from 100 to 150° C. Heating time is, for example, from 15 minutes to 5 hours.

When the adhesive sheet according to the present invention is heated, the substrate shrinks to give tension to the adhesive sheet fixed to the ring frame and thus the adhesive sheet is not deformed due to deflection. In addition, the sheet produces little or no softening of the adhesive layer caused by softening of a tackifying resin and thus does not excessively closely adhere to the semiconductor wafer. Accordingly, the inspection method of the present invention enables prevention of chip breakage and taking a longer period for the inspecting step that are caused by deformation of an adhesive sheet. Further in steps of irradiating with activating rays and picking up described later, the method is capable of sufficiently reducing the adhesion strength of the adhesive layer by irradiation with activating rays and thus preventing pickup failures and adhesive transfers.

(5) Activating Ray Irradiating Step

In a light irradiation step, the photocurable adhesive layer is irradiated with activating rays, such as ultraviolet rays, from the substrate side. As a light source for such ultraviolet rays, a low pressure mercury lamp, a high pressure mercury lamp, an ultra-high pressure mercury lamp, a metal halide lamp, a black light lamp, and the like may be used.

The adhesive layer is three dimensionally networked by being irradiated with light for curing to reduce the tack strength of the adhesive layer. Here, as described above, the adhesive sheet according to the present invention does not excessively closely adhere to a wafer or the like even under heating, and thus the adhesion strength is sufficiently reduced by irradiation with activating rays.

(6) Picking Up Step

In a picking up step, the semiconductor chip is peeled from the adhesive layer of the adhesive sheet. At this point, in the adhesive sheet according to the present invention, the adhesion strength is sufficiently reduced by the irradiation with ultraviolet rays and the like. Peeling between the adhesive layer and the chip or component is thus facilitated to obtain good pickup performance and not to cause failures, such as an adhesive transfer. Examples of the method of picking up include a method in which the semiconductor chip is transferred to another adhesive sheet, a method in which the adhesive sheet is squeegeed from the back side for peeling, and a method in which a needle pin or the like is used for pushing up. As needed, an expanding step may be provided before the picking up step. In the expanding step, the adhesive sheet is drawn out to enlarge the gap between the semiconductor chips and thus to facilitate pickup.

After the picking up step, the picked up chip or component is mounted to a leadframe via die attach paste. After mounting, the die attach paste is heated to heat adhere the chip or component to the leadframe. The chip or component mounted to the leadframe is then molded using a resin.

EXAMPLES

Example 1

A photocurable adhesive was prepared in accordance with the composition shown in "Table 1". The photocurable adhesive was applied on a separator film made of polyethylene terephthalate for coating to cause the adhesive layer after drying to have a thickness of 10 μm. This adhesive layer was laminated to a substrate and aged at 40° C. for 7 days to obtain an adhesive sheet. As the substrate (K-1), a biaxially oriented polypropylene film having a thickness of 30 μm (FC-201 produced by Oji F-Tex Co., Ltd.) was used.

TABLE 1

| | | | Examples | | | | | | | | |
|---|---|---|---|---|---|---|---|---|---|---|---|
| | | | 1 | 2 | 3 | 4 | 5 | 6 | 7 | 8 | 9 |
| | Base Material Film | | K-1 | K-2 | K-3 | K-4 | K-5 | K-1 | K-2 | K-3 | K-4 |
| | Thermal Shrinkage/% | | 2.0 | 1.5 | 3.3 | 1.1 | 4.8 | 2.0 | 1.5 | 3.3 | 1.1 |
| Photocurable Adhesive | (Meth)Acrylate Copolymer | A-1 | 100 | 100 | 100 | 100 | 100 | 100 | — | 100 | 100 |
| | | A-2 | — | — | — | — | — | — | 100 | — | — |
| | Photopolymerizable Compound | B-1 | 50 | 50 | 50 | 50 | 50 | 50 | 50 | — | 50 |
| | | B-2 | — | — | — | — | — | — | — | 50 | — |
| | Polyfunctional Isocyanate Curing Agent | C-1 | 3 | 3 | 3 | 3 | 3 | 3 | 3 | 3 | — |
| | | C-2 | — | — | — | — | — | — | — | — | 3 |
| | Photopolymerization Initiator | D-1 | 2 | 2 | 2 | 2 | 2 | — | — | — | — |
| | | D-2 | — | — | — | — | — | 2 | 2 | 2 | 2 |
| | | D-3 | — | — | — | — | — | — | — | — | — |
| | | D-4 | — | — | — | — | — | — | — | — | — |
| | Silicone-Based Copolymer | E-1 | 1.5 | 1.5 | 1.5 | 1.5 | 1.5 | 1.5 | 1.5 | 1.5 | 1.5 |
| | Tackifying Resin | F-1 | — | — | — | — | — | — | — | — | — |
| Evaluation | Deformation of Sheet after Heating | | ◎ | ◎ | ◎ | ○ | ○ | ◎ | ◎ | ◎ | ○ |
| | Chip Retentivity | | ◎ | ◎ | ◎ | ◎ | ◎ | ◎ | ◎ | ◎ | ◎ |
| | Pickup Performance | | ◎ | ◎ | ◎ | ◎ | ◎ | ◎ | ◎ | ◎ | ◎ |
| | Overall | | ◎ | ◎ | ◎ | ○ | ○ | ◎ | ◎ | ◎ | ○ |

TABLE 1-continued

| | | | Examples | | | | | | | |
|---|---|---|---|---|---|---|---|---|---|---|
| | | | 10 | 11 | 12 | 13 | 14 | 15 | 16 | 17 |
| | Base Material Film | | K-1 | K-1 | K-1 | K-1 | K-1 | K-1 | K-1 | K-1 |
| | Thermal Shrinkage/% | | 2.0 | 2.0 | 2.0 | 2.0 | 2.0 | 2.0 | 2.0 | 2.0 |
| Photocurable Adhesive | (Meth)Acrylate Copolymer | A-1 | 100 | 100 | 100 | 100 | 100 | 100 | 100 | 100 |
| | | A-2 | — | — | — | — | — | — | — | — |
| | Photopolymerizable Compound | B-1 | 50 | 50 | 5 | 150 | 200 | 50 | 50 | 50 |
| | | B-2 | — | — | — | — | — | — | — | — |
| | Polyfunctional Isocyanate Curing Agent | C-1 | 3 | 3 | 3 | 3 | 3 | 0.5 | 1 | 10 |
| | | C-2 | — | — | — | — | — | — | — | — |
| | Photopolymerization Initiator | D-1 | — | — | 2 | 2 | 2 | 2 | 2 | 2 |
| | | D-2 | — | — | — | — | — | — | — | — |
| | | D-3 | 2 | — | — | — | — | — | — | — |
| | | D-4 | — | 2 | — | — | — | — | — | — |
| | Silicone-Based Copolymer | E-1 | 1.5 | 1.5 | 1.5 | 1.5 | 1.5 | 1.5 | 1.5 | 1.5 |
| | Tackifying Resin | F-1 | — | — | — | — | — | — | — | — |
| Evaluation | Deformation of Sheet after Heating | | ◎ | ◎ | ◎ | ◎ | ◎ | ◎ | ◎ | ◎ |
| | Chip Retentivity | | ◎ | ◎ | ◎ | ◎ | ◎ | ◎ | ◎ | ◎ |
| | Pickup Performance | | ◎ | ◎ | ○ | ◎ | ○ | ○ | ◎ | ◎ |
| | Overall | | ◎ | ◎ | ○ | ◎ | ○ | ○ | ◎ | ◎ |

| | | | Examples | | | | | | | |
|---|---|---|---|---|---|---|---|---|---|---|
| | | | 18 | 19 | 20 | 21 | 22 | 23 | 24 | 25 |
| | Base Material Film | | K-1 | K-1 | K-1 | K-1 | K-1 | K-1 | K-1 | K-1 |
| | Thermal Shrinkage/% | | 2.0 | 2.0 | 2.0 | 2.0 | 2.0 | 2.0 | 2.0 | 2.0 |
| Photocurable Adhesive | (Meth)Acrylate Copolymer | A-1 | 100 | 100 | 100 | 100 | 100 | 100 | 100 | 100 |
| | | A-2 | — | — | — | — | — | — | — | — |
| | Photopolymerizable Compound | B-1 | 50 | 50 | 50 | 50 | 50 | 50 | 50 | 50 |
| | | B-2 | — | — | — | — | — | — | — | — |
| | Polyfunctional Isocyanate Curing Agent | C-1 | 20 | 3 | 3 | 3 | 3 | 3 | 3 | 3 |
| | | C-2 | — | — | — | — | — | — | — | — |
| | Photopolymerization Initiator | D-1 | 2 | 0.1 | 1 | 10 | 20 | 2 | 2 | 2 |
| | | D-2 | — | — | — | — | — | — | — | — |
| | | D-3 | — | — | — | — | — | — | — | — |
| | | D-4 | — | — | — | — | — | — | — | — |
| | Silicone-Based Copolymer | E-1 | 1.5 | 1.5 | 1.5 | 1.5 | 1.5 | — | 1.5 | 1.5 |
| | Tackifying Resin | F-1 | — | — | — | — | — | — | 2 | 0.5 |
| Evaluation | Deformation of Sheet after Heating | | ◎ | ◎ | ◎ | ◎ | ◎ | ◎ | ◎ | ◎ |
| | Chip Retentivity | | ○ | ◎ | ◎ | ◎ | ○ | ◎ | ◎ | ◎ |
| | Pickup Performance | | ◎ | ○ | ◎ | ◎ | ◎ | ○ | ○ | ◎ |
| | Overall | | ○ | ○ | ◎ | ◎ | ○ | ○ | ○ | ◎ |

[Substrate]

K-1: biaxially oriented polypropylene (FC-201 produced by Oji F-Tex Co., Ltd., thickness: 30 μm); thermal shrinkage at 120° C. of 2.0%.

K-2: biaxially oriented polypropylene (E-201F produced by Oji F-Tex Co., Ltd., thickness: 40 μm), thermal shrinkage at 120° C. of 1.5%.

K-3: biaxially oriented polypropylene (PYLEN film-OT P2111 produced by Toyobo Co., Ltd., thickness: 30 μm); thermal shrinkage at 120° C. of 3.3%.

K-4: biaxially oriented polypropylene (synthetic product, thickness: 30 μm); thermal shrinkage at 120° C. of 1.1%.

K-5: biaxially oriented polypropylene (synthetic product, thickness: 30 μm); thermal shrinkage at 120° C. of 4.8%.

[Photocurable Adhesive]

(Meth)Acrylate Copolymer

A-1: acrylic rubber AR53L produced by Zeon Corp.; copolymer of ethyl acrylate 54%, butyl acrylate 19%, and methoxyethyl acrylate 24%, obtained by emulsion polymerization.

A-2: SK-Dyne 1496 produced by Soken Chemical & Engineering Co., Ltd.; copolymer of 2-ethylhexyl acrylate 96% and 2-hydroxyethyl acrylate 4%, obtained by solution polymerization.

Photopolymerizable Compound

B-1: UN-905 produced by Negami chemical industrial co., ltd.; product of reacting acrylate having dipentaerythritol pentaacrylate as a main component with a timer of isophorone diisocyanate and having 15 vinyl groups.

B-2: A-TMPT produced by Shin Nakamura Chemical Co., Ltd.; trimethylolpropane triacrylate, having three vinyl groups.

Polyfunctional Isocyanate Curing Agent

C-1: Coronate L-45E produced by Nippon Polyurethane Industry Co., Ltd.; trimethylolpropane adduct of 2,4-tolylene diisocyanate.

C-2: trimethylene diisocyanate

Photopolymerization Initiator

D-1: IRGACURE 127 produced by BASF Japan Ltd.; 2-hydroxy-1-{4-[4-(2-hydroxy-2-methyl-propionyl)-benzyl]-phenyl}-2-methyl-propane-1-one; temperature at mass reduction rate of 10% of 275° C.

D-2: IRGACURE OXE02 produced by BASF Japan Ltd.; ethanone, 1-[9-ethyl-6-(2-methylbenzoyl)-9H-carbazole-3-yl]-, 1-(O-acetyloxime), temperature at mass reduction rate of 10% of 320° C.

D-3: LUCIRIN TPO produced by BASF Japan Ltd.; 2,4,6-trimethylbenzoyl-diphenyl-phosphine oxide, temperature at mass reduction rate of 10% of 270° C.

D-4: IRGACURE 651 produced by BASF Japan Ltd.; benzyl dimethyl ketal, temperature at mass reduction rate of 10% of 185° C.

Silicone-Based Graft Copolymer

E-1: UTMM-LS2 produced by Soken Chemical & Engineering Co., Ltd.; silicone-based graft copolymer obtained by polymerizing silicone-based oligomer unit having (meth)acryloyl group and acrylic vinyl unit composed of methyl methacrylate and the like at end of silicone molecule chain.

Tackifying Resin

F-1: YS POLYSTER S145 produced by Yasuhara Chemical Co., Ltd.; terpene phenolic tackifying resin, softening point of 145° C.

The adhesive sheet thus obtained was bonded to a ring frame and a silicon wafer having a diameter of 8 inches × a thickness of 0.1 mm and formed with a dummy circuit pattern. The silicon wafer was placed on a hot plate to make contact with a surface opposite to an adhesive sheet bonding surface and heated at 120° C. for 1 hour, followed by the respective steps of dicing, light irradiation, and picking up.

The dicing step was carried out in the following conditions.
Dicing Apparatus: DAD341 manufactured by DISCO Corp.
Dicing Blade: NBC-ZH2050-27HEEE manufactured by DISCO Corp.
Dicing Blade Shape: outer diameter of 55.56 mm, blade width of 35 μm, inner diameter of 19.05 mm
Number of Dicing Blade Revolution: 40,000 rpm
Dicing Blade Feed Rate: 50 mm/sec.
Dicing Size: 10 mm square
Cutting Depth into Adhesive Sheet: 15 μm
Cutting Water Temperature: 25° C.
Amount of Cutting Water: 1.0 liter/min.

The light irradiation step was carried out in the following conditions.
Ultraviolet Irradiation: exposure dose of 150 mJ/cm$^2$ by high pressure mercury lamp The picking up step was carried out in the following conditions.
On the diced wafer, an adhesive sheet for transfer (tack strength to silicon wafer: 6.25 N/25 mm) was bonded and then the adhesive sheet for transfer was peeled off to transfer the chip.

In the heating step, evaluation was performed as follows.
(1) Deformation of Adhesive Sheet
The adhesive sheet after heating at 120° C. for 1 hour was observed for evaluation by the following criteria.
⊙ (Excellent): no "deflection" and "peeling" occur in the adhesive sheet even after heating.
○ (Good): slight "deflection" and "peeling" occur in the adhesive sheet due to heating.
× (Failure): "deflection" and "peeling" occur in the adhesive sheet due to heating.

In the dicing step and the picking up step, evaluation was performed as follows.

(1) Chip Retentivity
The chip retentivity was evaluated after the dicing step by the following criteria based on a residual ratio of the semiconductor chips retained on the adhesive sheet.
⊙ (Excellent): less than 5% of the chips were detached.
○ (Good): 5% or more and less than 10% of the chips were detached.
× (Failure): 10% or more of the chips were detached.

(2) Pickup Performance
The pickup performance was evaluated in the picking up step by the following criteria based on a transfer success rate (pickup success rate) by transferring the semiconductor chips using the adhesive sheet for transfer.
⊙ (Excellent): the chip pickup success rate was 95% or more.
○ (Good): the chip pickup success rate was 80% or more and less than 95%.
× (Failure): the chip pickup success rate was less than 80%.

Evaluation results are shown in "Table 1". According to Example 1, no deformation of the adhesive sheet was found after the heating step, and both the chip retentivity and the pickup performance were evaluated as excellent.

Examples 2 Through 25

Adhesive sheets were manufactured in the same manner as in Example 1 other than changing the type or the presence of the materials for the substrate, the (meth)acrylate copolymer, the photopolymerizable compound, the polyfunctional isocyanate curing agent, the photopolymerization initiator, and the silicone-based graft copolymer as shown in "Table 1" for evaluation. The results are shown in the table.

Comparative Examples 1 Through 3, 5 Through 10

Adhesive sheets were manufactured in the same manner as in Example 1 other than using the following substrates as the substrate for evaluation. The results are shown in Table 2.

K-6: polyethylene terephthalate (EMBLET PET produced by Unitika Ltd., thickness: 25 μm); thermal shrinkage at 120° C. of 0.5%
K-7: cyclic olefin copolymer (F film produced by Gunze Ltd., thickness: 100 μm); thermal shrinkage at 120° C. of 0.1%
K-8: biaxially oriented polypropylene (synthetic product, thickness: 30 μm); thermal shrinkage at 120° C. of 6.0%

Comparative Example 4

An adhesive sheet was manufactured in the same manner as in Example 1 other than adding a tackifying resin but not adding the silicone-based graft copolymer for evaluation. The results are shown in the table.

TABLE 2

|  |  |  | Comparative Examples | | | | | | | | | |
|---|---|---|---|---|---|---|---|---|---|---|---|---|
|  |  |  | 1 | 2 | 3 | 4 | 5 | 6 | 7 | 8 | 9 | 10 |
|  | Base Material Film |  | K-6 | K-7 | K-8 | K-1 | K-1 | K-1 | K-1 | K-1 | K-1 | K-1 |
|  | Thermal Shrinkage/% |  | 0.5 | 0.1 | 6.0 | 2.0 | 2.0 | 2.0 | 2.0 | 2.0 | 2.0 | 2.0 |
| Photocurable Adhesive | (Meth)Acrylate Copolymer | A-1 | 100 | 100 | 100 | 100 | 10C | 100 | 100 | 100 | 100 | 100 |
|  |  | A-2 | — | — | — | — | — | — | — | — | — | — |
|  | Photopolymerizable Compound | B-1 | 50 | 50 | 50 | 50 | 1 | 250 | 50 | 50 | 50 | 50 |
|  |  | B-2 | — | — | — | — | — | — | — | — | — | — |
|  | Polyfunctional Isocyanate Curing Agent | C-1 | 3 | 3 | 3 | 3 | 3 | 3 | 0.1 | 25 | 3 | 3 |
|  |  | C-2 | — | — | — | — | — | — | — | — | — | — |

TABLE 2-continued

| | | | Comparative Examples | | | | | | | | | |
|---|---|---|---|---|---|---|---|---|---|---|---|---|
| | | | 1 | 2 | 3 | 4 | 5 | 6 | 7 | 8 | 9 | 10 |
| | Photopolymerization Initiator | D-1 | 2 | 2 | 2 | 2 | 2 | 2 | 2 | 2 | 0.01 | 25 |
| | | D-2 | — | — | — | — | — | — | — | — | — | — |
| | | D-3 | — | — | — | — | — | — | — | — | — | — |
| | | D-4 | — | — | — | — | — | — | — | — | — | — |
| | Silicone-Based Copolymer | E-1 | 1.5 | 1.5 | 1.5 | — | 1.5 | 1.5 | 1.5 | 1.5 | — | — |
| | Tackifying Resin | F-1 | — | — | — | 5 | — | — | — | — | 5 | 5 |
| Evaluation | Deformation of Sheet after Heating | | X | X | X | ◎ | ◎ | ◎ | ◎ | ◎ | ◎ | ◎ |
| | Chip Retentivity | | — | — | — | ◎ | ◎ | ◎ | ◎ | X | ◎ | ○ |
| | Pickup Performance | | — | — | — | X | X | X | X | ○ | X | X |
| | Overall | | X | X | X | X | X | X | X | X | X | X |

According to Examples 2 through 25, little or no deformation of the adhesive sheets was found after the heating step, and good chip retentivity and pickup performance were confirmed. In contrast, the adhesive sheets of Comparative Examples 1 and 2 were deformed after heating. In the adhesive sheet of Comparative Example 3, the tape was partially peeled after heating. The adhesive sheets in Comparative Examples 4 through 7 and 9 through 10 had failures in pickup performance and noticeable adhesive transfers. The adhesive sheet in Comparative Example 8 had poor chip retentivity.

The adhesive sheet according to the present invention is not deformed even when it is heated and also does not excessively closely adhere to a semiconductor wafer. The adhesive sheet is thus capable of sufficient reduction in adhesion strength of the adhesive layer by irradiation with ultraviolet rays and the like to obtain good pickup performance. In a semiconductor equipment manufacturing procedure, it is accordingly possible to use the adhesive sheet according to the present invention for performance inspection of semiconductor chips under heating. This enables to learn malfunctioning of a chip at high temperatures before a packaging step, leading to reduction in packaging costs.

The invention claimed is:

1. A heat resistant adhesive sheet for semiconductor inspection, the adhesive sheet used in a step of performance inspection of a semiconductor chip under heating, the adhesive sheet comprising an adhesive layer on a substrate, wherein
   the substrate has a thermal shrinkage when heated at 120° C. for 15 minutes from 1.0% to 5.0%, and the adhesive layer includes:
   100 parts by mass of a (meth)acrylate copolymer;
   from 5 to 200 parts by mass of a photopolymerizable compound;
   from 0.5 to 20 parts by mass of a polyfunctional isocyanate curing agent;
   from 0.1 to 20 parts by mass of a photopolymerization initiator; and
   from 0 to 2 parts by mass of a tackifying resin.

2. The sheet of claim 1, wherein the substrate is a biaxially oriented film.

3. The sheet of claim 1, wherein the adhesive layer of the adhesive sheet includes a peelability imparting agent.

4. The sheet of claim 3, wherein the peelability imparting agent is made from a silicone-based graft copolymer.

5. The sheet of claim 3, wherein the peelability imparting agent is added in an amount from 0.1 to 20 parts by mass based on 100 parts by mass of the (meth)acrylate copolymer.

6. The sheet of claim 1, wherein the polyfunctional isocyanate curing agent has three or more isocyanate groups.

7. The sheet of claim 1, wherein the photopolymerization initiator has a mass reduction rate, when heated from 23° C. at a rate of temperature rise of 10° C./min., of 10% at a temperature of 250° C. or more.

8. A semiconductor inspection method, comprising:
   adsorbing a semiconductor chip by placing the semiconductor chip in a state of being bonded to an adhesive sheet on a stage from 100 to 150° C. to contact the adhesive sheet with the stage for adsorption fixation;
   inspecting performance of the semiconductor chip while heating the stage from 100 to 150° C.;
   irradiating the adhesive sheet with an activating ray; and
   picking up the semiconductor chip from the adhesive sheet, wherein
   the adhesive sheet is the sheet of claim 1.

9. The method of claim 8, further comprising, before the adsorbing:
   bonding the adhesive sheet to a semiconductor wafer; and
   dicing the semiconductor wafer into the semiconductor chip.

* * * * *